(12) United States Patent
Kitayama et al.

(10) Patent No.: US 10,489,732 B2
(45) Date of Patent: Nov. 26, 2019

(54) PRODUCTION LINE MANAGEMENT METHOD AND PRODUCTION LINE MANAGEMENT SYSTEM

(75) Inventors: Jun Kitayama, Chiryu (JP); Takashi Kurashina, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 444 days.

(21) Appl. No.: 14/425,190

(22) PCT Filed: Sep. 3, 2012

(86) PCT No.: PCT/JP2012/072385
§ 371 (c)(1),
(2), (4) Date: Mar. 2, 2015

(87) PCT Pub. No.: WO2014/033960
PCT Pub. Date: Jun. 3, 2014

(65) Prior Publication Data
US 2015/0206086 A1    Jul. 23, 2015

(51) Int. Cl.
*H05K 13/08* (2006.01)
*B23P 21/00* (2006.01)
(Continued)

(52) U.S. Cl.
CPC ... *G06Q 10/06316* (2013.01); *G05B 19/4188* (2013.01); *G06Q 10/0631* (2013.01);
(Continued)

(58) Field of Classification Search
CPC ......... G06Q 10/06316; G06Q 10/0631; G06Q 50/04; G06Q 190/10; G06Q 10/00;
(Continued)

(56) References Cited

U.S. PATENT DOCUMENTS

| 4,638,232 A * | 1/1987 | Stridsberg | G05B 19/4015 318/568.1 |
| 5,317,802 A * | 6/1994 | Jyoko | G05B 19/41805 29/832 |

(Continued)

FOREIGN PATENT DOCUMENTS

| CN | 1630466 A | 6/2005 |
| CN | 1863451 | * 11/2006 |

(Continued)

OTHER PUBLICATIONS

Jouni Smed, Mika Johnsson*, Mikko Puranen, Timo Leipa¬la¬, Olli Nevalainen, Job grouping in surface mounted component printing, Robotics and Computer-Integrated Manufacturing 15 (1999) 39-49 (Year: 1999).*

(Continued)

*Primary Examiner* — Hafiz A Kassim
*Assistant Examiner* — Abdallah A El-Hage Hassan
(74) *Attorney, Agent, or Firm* — Oblon, McClelland, Maier & Neustadt, L.L.P.

(57) ABSTRACT

A production line management system that registers and manages distribution data for each of a plurality of production lines, and thus, manages work data in a unitary manner. The management system being constructed to manage production in a plurality of the production lines with a small amount of data and to simplify a system configuration. In particular, the distribution data is created by an identifier added to work data.

19 Claims, 6 Drawing Sheets

(51) Int. Cl.
*G06Q 10/00* (2012.01)
*G06Q 10/06* (2012.01)
*G05B 19/418* (2006.01)
*G06Q 50/04* (2012.01)

(52) U.S. Cl.
CPC .......... *G06Q 50/04* (2013.01); *H05K 13/085* (2018.08); *B23P 21/00* (2013.01); *G05B 2219/31396* (2013.01); *G05B 2219/31406* (2013.01); *Y02P 90/04* (2015.11); *Y02P 90/18* (2015.11); *Y02P 90/20* (2015.11); *Y02P 90/24* (2015.11); *Y02P 90/30* (2015.11)

(58) Field of Classification Search
CPC .... G06Q 10/06; G06Q 10/04; G05B 19/4188; G05B 2219/31396; G05B 2219/31406; G05B 19/418; H05K 13/08; H05K 13/085; Y02P 90/24; Y02P 90/04; Y02P 90/20; Y02P 90/18; Y02P 90/30; B23P 21/00
USPC ....................................................... 705/7.23
See application file for complete search history.

(56) References Cited

U.S. PATENT DOCUMENTS

| | | | | | |
|---|---|---|---|---|---|
| 5,321,619 | A | * | 6/1994 | Matsuda | B62D 65/005 235/375 |
| 5,434,792 | A | * | 7/1995 | Saka | G05B 19/4183 235/375 |
| 5,673,194 | A | * | 9/1997 | Cipelletti | G05B 19/4183 700/115 |
| 5,980,086 | A | | 11/1999 | Kanematsu et al. | |
| 5,999,920 | A | * | 12/1999 | Sato | G06Q 10/04 705/400 |
| 6,016,599 | A | * | 1/2000 | Morita | H05K 13/0812 29/833 |
| 7,356,176 | B2 | * | 4/2008 | Fujii | G01N 21/8851 382/141 |
| 2002/0035409 | A1 | * | 3/2002 | Lingua | G05B 19/0428 700/157 |
| 2002/0138673 | A1 | * | 9/2002 | Schaffer | G05B 19/41865 710/28 |
| 2004/0049433 | A1 | * | 3/2004 | Yokoyama | G05B 19/00 705/26.1 |
| 2004/0117358 | A1 | * | 6/2004 | von Kaenel | G06F 17/30241 |
| 2005/0165505 | A1 | * | 7/2005 | Moriya | H05K 13/086 700/121 |
| 2006/0106473 | A1 | | 5/2006 | Enright et al. | |
| 2006/0149406 | A1 | * | 7/2006 | Chen | G05B 19/41865 700/107 |
| 2007/0277369 | A1 | * | 12/2007 | Kawazoe | H05K 13/0061 29/729 |
| 2008/0009959 | A1 | | 1/2008 | Enright et al. | |
| 2008/0110011 | A1 | | 5/2008 | Reed et al. | |
| 2008/0221721 | A1 | | 9/2008 | Reed et al. | |
| 2008/0271305 | A1 | | 11/2008 | Reed et al. | |
| 2008/0319569 | A1 | * | 12/2008 | Loopstra | G03F 7/70775 700/110 |
| 2010/0004774 | A1 | * | 1/2010 | Chen | G05B 19/4063 700/108 |
| 2010/0274602 | A1 | | 10/2010 | Kaufman et al. | |

FOREIGN PATENT DOCUMENTS

| | | | | |
|---|---|---|---|---|
| CN | 1863451 | A | | 11/2006 |
| CN | 102325439 | A | | 1/2012 |
| EP | 2 244 216 | A1 | | 10/2010 |
| GB | 2 257 541 | A | | 1/1993 |
| JP | 05-285753 | A | | 11/1993 |
| JP | 2005215979 | | * | 1/2004 .......... G05B 19/418 |
| JP | 2005215979 | | * | 8/2005 |
| JP | 2009-282914 | A | | 12/2009 |
| JP | 2012-089552 | A | | 5/2012 |
| JP | 2005215979 | | * | 8/2015 |
| WO | WO 02/056125 | A2 | | 7/2002 |
| WO | WO 2006/078710 | A1 | | 7/2006 |
| WO | WO-2014109035 | A1 | * | 7/2014 .......... H05K 13/0882 |
| WO | WO2014109035 | A1 | * | 7/2014 .......... H05K 13/0882 |

OTHER PUBLICATIONS

Ronald E.WatkinsJeffery K.CochranPhD, PE, A line balancing heuristic case study for existing automated surface mount assembly line setups, Computers & Industrial Engineering vol. 29, Issues 1-4, Sep. 1995, pp. 681-685 (Year: 1995).*

T. Liukkonen; A. Tuominen, A case study of SPC in circuit board assembly: statistical mounting process control, 2004 24th International Conference on Microelectronics (IEEE Cat. No. 04TH8716) (Year: 2004).*

Extended European Search Report dated Jun. 8, 2016 in Patent Application No. 12883960.2.

International Search Report dated Oct. 16, 2012 in PCT/JP2012/072385 Filed Sep. 3, 2012.

Extended European Search Report dated Mar. 3, 2017 in Patent Application No. 16205916.6.

Chinese Office Action dated Feb. 28, 2017 in Patent Application No. 201280075577.8 (with English language translation and English translation of categories of cited documents).

Chinese Office Action dated Jul. 14, 2016 in Patent Application No. 201280075577.8 (with English translation).

* cited by examiner

PRODUCTION LINE MANAGEMENT METHOD AND PRODUCTION LINE MANAGEMENT SYSTEM

TECHNICAL FIELD

The present disclosure relates to a management method and a management system for production lines producing products.

BACKGROUND ART

For example, PTL 1 describes a management system which manages mounting lines each configured by combining a component mounter and peripheral equipment. The management system integrally manages a plurality of line management computers which respectively manage a plurality of mounting lines with a single centralized management computer. The centralized management computer is provided with a line configuration file which stores specific data of a component mounter configuring each mounting line and peripheral equipment, and a mounting data file which stores mounting data related to a component mounting pattern. The centralized management computer performs analysis referring to specific data of the line configuration file such that the work time of each component mounter is made equal, divides mounting data of the mounting data file, allocates mounting data to each component mounter, and transfers mounting data to each line management computer. Each line management computer operates the component mounter of the mounting line based on the transferred mounting data.

CITATION LIST

Patent Literature

PTL 1: JP-A-5-285753

SUMMARY

Technical Problem

In the management system for mounting lines described in PTL 1, since each of the centralized management computer and a plurality of line computers respectively have mounting data divided and allocated to the component mounter, it is necessary to manage a large amount of data.

The present disclosure considers the above-described situation, and an object of the present disclosure is to provide a management method and a management system for production lines capable of managing production in a plurality of production lines with a smaller amount of data.

Solution to Problem

In order to solve the above-described problem, one aspect of the present disclosure includes a management method for production lines producing products, in which configuration data of working machines configuring the production lines, work data regarding work to produce the products, and distribution data for distributing the work data to the working machines based on the configuration data are provided, and the distribution data is registered and managed for each production line.

Another aspect of the present disclosure provides a management system for production lines producing products, the management system including configuration data storage means for storing configuration data of working machines configuring the production lines, work data storage means for storing work data regarding work to produce the products, distribution data creation means for creating distribution data to distribute the work data to the working machines based on the configuration data, and registration management means for registering and managing the distribution data for each production line.

Another aspect of the present disclosure provides that the work data storage means stores the work data with an identifier added thereto, and the distribution data creation means creates the distribution data using the identifier.

Another aspect of the present disclosure includes work time calculation means for obtaining a work time of each of the working machines included in the plurality of production lines based on the distributed work data, and work time display means for classifying the obtained work time of each working machine for each production line, selecting the maximum work time among the classified work times of each production line for each production line, and displaying the maximum work time on a display device.

Another aspect of the present disclosure includes data display means for displaying the configuration data, the work data, and the distribution data on a display device, and data rearrangement means for rearranging the displayed distribution data according to a command to rearrange the distribution data input from the outside based on the displayed configuration data, work data, and distribution data.

Another aspect of the present disclosure provides that the production lines are mounting lines which manufacture a substrate with a component mounted thereon, the working machines are component mounting machines, the work data is configured by the mounting position of the component expressed by a coordinate system of the substrate, the mounting angle of the component, and the type of the component, and each of the component mounting machines absorbs a component corresponding to the type of the component based on the work data, converts the mounting position of the component expressed by the coordinate system of the substrate to a coordinate system of the component mounting machine, and mounts the component at the mounting position of the component.

Advantageous Effects

According to the present disclosure, since distribution data is registered and managed for each production line, it is possible to manage work data in a unitary manner. With this, it is possible to manage production in a plurality of production lines with a small amount of data. Furthermore, since the amount of data is made small, it is possible to easily perform data edition and to perform data transfer in a short time.

According to the present disclosure, since the management system registers and manages distribution data for each production line, it is possible to manage work data in a unitary manner. With this, it is possible to construct a management system capable of managing production in a plurality of production lines with a small amount of data and to simplify a system configuration.

According to the present disclosure, distribution data is created by an identifier added to work data. With this, it is possible to achieve reduction in the amount of distribution data.

According to the present disclosure, when managing a plurality of production lines each producing the same type of products, the management system displays the maximum work time among the work times of each production line on the display device. That is, the cycle time of each production line is displayed. With this, it is possible for an operator to select a production line with high production efficiency from a plurality of production lines and to easily confirm an index of production planning.

According to the present disclosure, the management system rearranges distribution data according to external input. With this, it is possible for the operator to improve production efficiency in each of a plurality of production lines.

According to the present disclosure, when managing the mounting lines, the management system stores the mounting position of the component expressed by the coordinate system of the substrate as work data. With this, for each of a plurality of component mounting machines, it is not necessary to store the mounting position of the component expressed by the coordinate system of the machine, and mounting can be performed by converting the mounting position of the component expressed by the coordinate system of the substrate in each component mounting machine to the mounting position of the component expressed by the coordinate system of the machine. Therefore, it is possible to manage substrate manufacturing in a plurality of mounting lines with a small amount of data.

DESCRIPTION OF EMBODIMENTS

Figure 1:
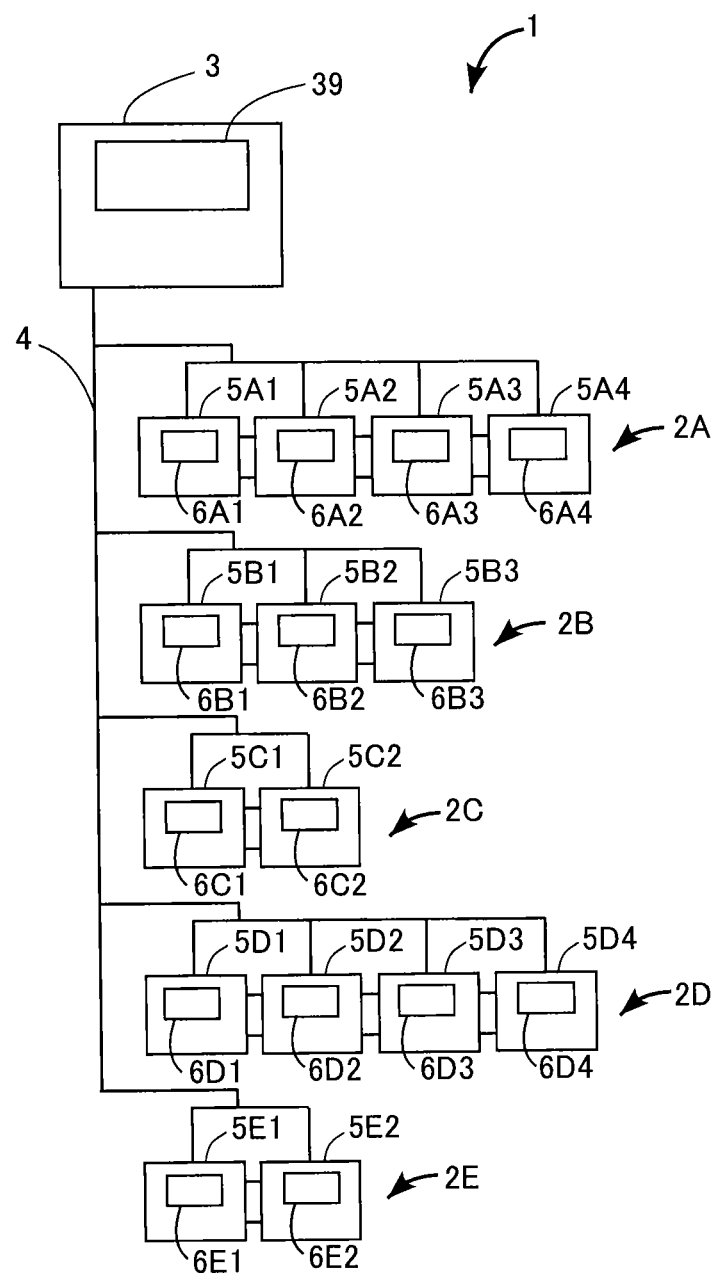
FIG. 1 is a diagram showing the schematic configuration of a management system for production lines according to an embodiment of the present disclosure.

Hereinafter, an embodiment of a management system for production lines according to the present disclosure will be described referring to the drawings. The management system for production lines can be applied to, for example, a management system for mounting lines which sequentially executes substrate transport and a plurality of types of work, that is, solder printing, component mounting, reflow, and the like to mount a component on the substrate. In this embodiment, for convenience of description, a management system for a plurality of mounting lines each including a plurality of component mounting machines will be described.

As shown in FIG. 1, a mounting line management system 1 according to this embodiment includes a plurality (in this example, five) of mounting lines 2A, 2B, 2C, 2D, and 2E, a single management computer 3, a communication network 4 which connects the respective mounting lines 2A to 2E and the management computer 3, and the like.

The mounting line 2A includes a plurality (in this example, four) of component mounting machines 5A1, 5A2, 5A3, and 5A4. Similarly, the mounting line 2B includes three component mounting machines 5B1, 5B2, and 5B3, the mounting line 2C includes two component mounting machines 5C1 and 5C2, the mounting line 2D includes four component mounting machines 5D1, 5D2, 5D3, and 5D4, and the mounting line 2E includes two component mounting machines 5E1 and 5E2.

The same component-mounted substrate, that is, a component-mounted substrate with a plurality of the same type of components mounted on the same type of substrate is manufactured in one mounting line or a plurality of mounting lines. Specifically, the same component-mounted substrate is manufactured in each of the mounting lines 2A, 2B, and 2D, and the same component-mounted substrate is manufactured in two lines of the mounting line 2C and the mounting line 2E.

The management computer 3 transmits and receives data with respect to control devices 6A1 to 6E2 of the component mounting machines 5A1 to 5E2 of the mounting lines 2A to 2E through the communication network 4 to manage substrate manufacturing of the respective mounting lines 2A to 2E.

Figure 2:
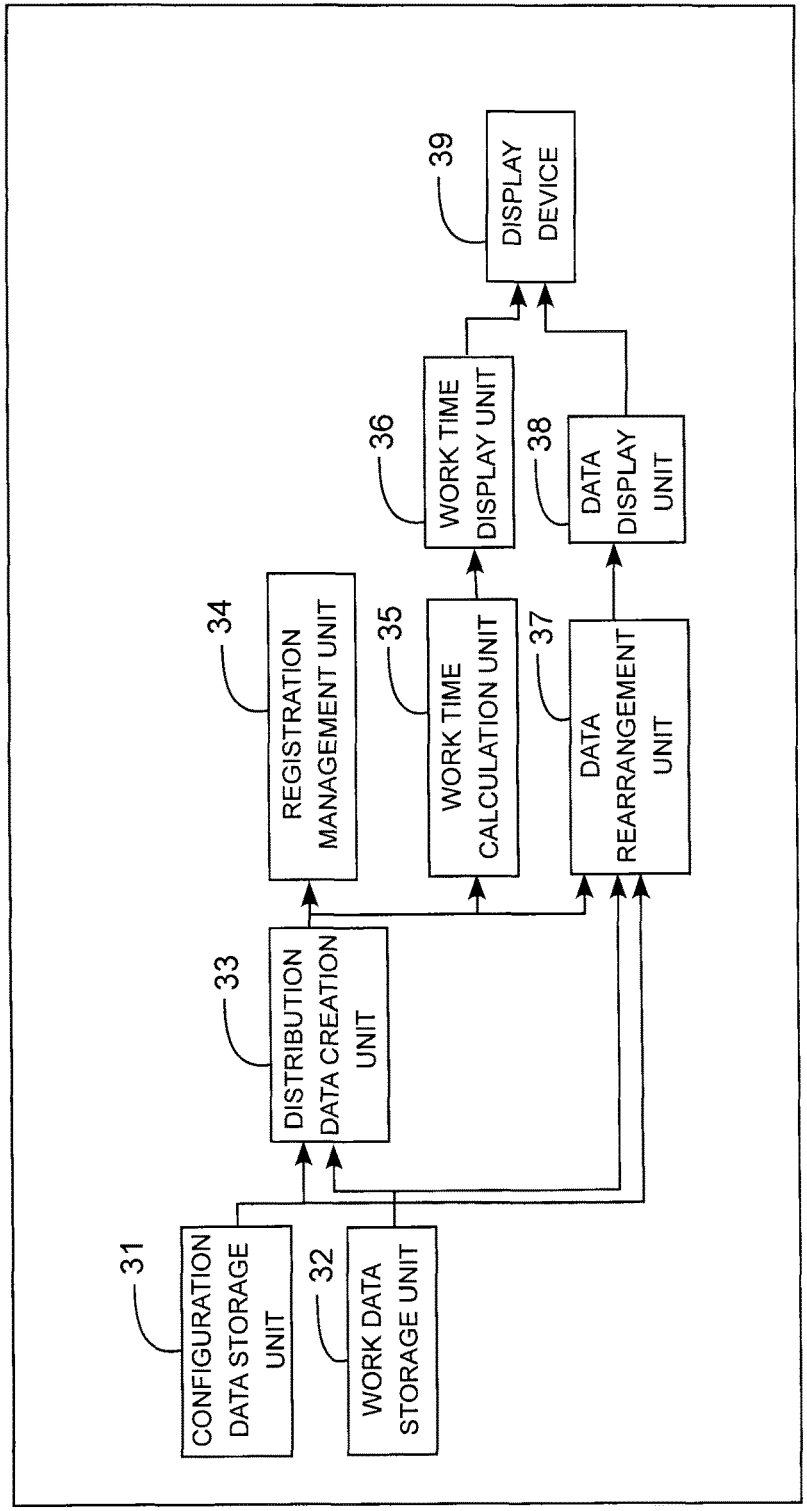
FIG. 2 is a block diagram showing the schematic configuration of a management computer of the management system of FIG. 1.

As shown in FIG. 2, the management computer 3 is provided with a configuration data storage unit 31, a work data storage unit 32, a distribution data creation unit 33, a registration management unit 34, a work time calculation unit 35, a work time display unit 36, a data rearrangement unit 37, a data display unit 38, a display device 39, and the like.

Figure 4:
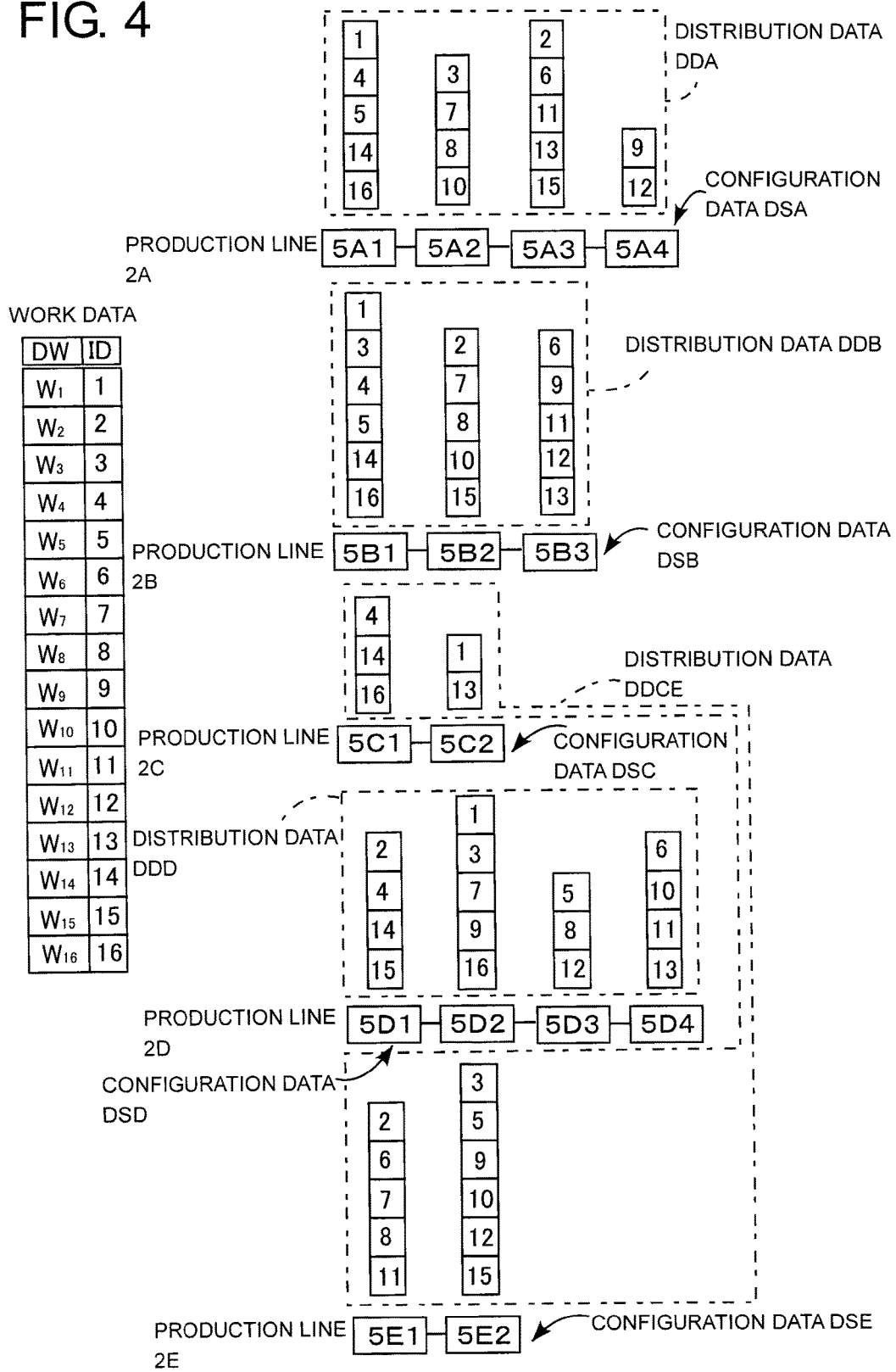
FIG. 4 is a diagram showing the configuration of data stored in the management computer of FIG. 2.

The configuration data storage unit 31 stores configuration data of the component mounting machines 5A1 to 5E2 configuring the respective mounting lines 2A to 2E. Specifically, as shown in FIG. 4, configuration data DSA of the mounting line 2A has a data configuration in which the four component mounting machines 5A1 to 5A4 are displayed in an arrangement order from a downstream side toward an upstream side. Similarly, configuration data DSB of the mounting line 2B has a data configuration in which the component mounting machines 5B1 to 5B3 are displayed in an arrangement order from a downstream side toward an upstream side, configuration data DSC of the mounting line 2C has a data configuration in which the component mounting machines 5C1 and 5C2 are displayed in an arrangement order from a downstream side toward an upstream side, configuration data DSD of the mounting line 2D has a data configuration in which the component mounting machines 5D1 to 5D3 are displayed in an arrangement order from a downstream side toward an upstream side, and configuration data DSE of the mounting line 2E has a data configuration in which the component mounting machines 5E1 and 5E2 are displayed in an arrangement order from a downstream side toward an upstream side.

The work data storage unit 32 stores work data regarding work for mounting a component on a substrate, that is, data regarding the mounting position of the component expressed by the coordinate system of the substrate or the mounting angle of the component and the type of mounting component. Specifically, as shown in FIG. 4, work data has a data configuration in which an identifier ID (in this example, ID=a number of 1 to 16) for identifying each piece of sequence data DW is added to sequence data DW (in this example, DW=16 pieces of data of $W_1$ to $W_{16}$) for mounting a plurality of the same type of components on the same type of substrate. Sequence data DW is configured by the mounting position (X,Y) and the mounting angle θ of the component in the XY orthogonal coordinate of the substrate, and the type (name) of mounting component. The mounting angle θ is a predetermined angle including 0 degrees set by mounting component. Such work data is created for each type of substrate.

Figure 6:
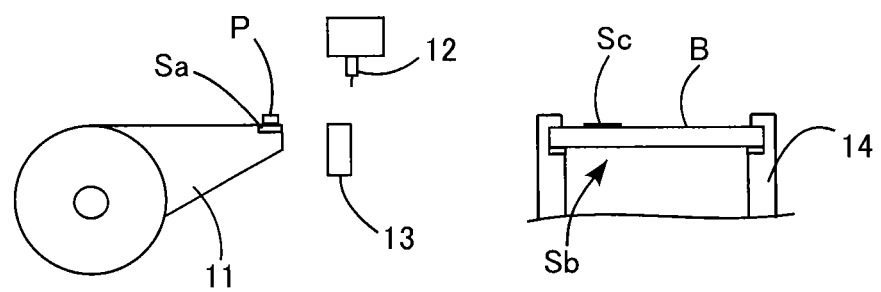
FIG. 6 is a diagram illustrating a component mounting operation when managing mounting lines.

A component mounting operation based on work data will be described. As shown in FIG. 6, in the control devices 6A1 to 6E2 of the component mounting machines 5A1 to 5E2, a feeder 11 which feeds a component P is specified referring to the type (name) of mounting component of work data. A suction nozzle 12 is moved to a component feed position Sa of the specified feeder 11, and the fed component P is sucked by the suction nozzle 12. The sucked component P is imaged by a camera 13, and if necessary, the component P is rotated such that the suction angle becomes the mounting angle referring to the mounting angle θ of the component of work data. The mounting position (X, Y) of the component in the XY orthogonal coordinate system of the substrate of work data is converted to the coordinate systems of the component mounting machines 5A1 to 5E2, and the component P is moved above the substrate B transported and positioned at a substrate feed position Sb by a substrate transport device 14 and is mounted at a coordinate-converted component mounting position Sc. The above operation is repeated by the number of mounting components.

As described above, since the mounting position (X,Y) in the XY orthogonal coordinate system of the substrate is stored as work data, for each of a plurality of component mounting machines 5A1 to 5E2, it is not necessary to store the mounting position of the component P expressed by the coordinate system of each machine. For example, since sequence data $W_1$, $W_4$, $W_5$, $W_{14}$, and $W_{16}$ corresponding to the identifiers 1, 4, 5, 14, and 16 are transmitted to the control device 6A1 of the component mounting machine 5A1 of the mounting line 2A, the mounting position (X,Y) of the component in the XY orthogonal coordinate system of the substrate of each piece of sequence data $W_1$, $W_4$, $W_5/W_{14}$, and $W_{16}$ may be converted to the coordinate system of the component mounting machine 5A1. Therefore, it is possible to manage substrate manufacturing in a plurality of mounting lines 2A to 2E with a small amount of data.

The distribution data creation unit 33 creates distribution data for distributing work data to the respective component mounting machines 5A1 to 5E2 based on configuration data. This distribution data is configured by the identifier ID for identifying each piece of sequence data DW of work data. The distribution data creation unit 33 performs analysis referring to configuration data for each of the mounting lines 2A, 2B, 2D, and 2C+2E which manufactures the component-mounted substrate with a plurality of the same type of components mounted on the same type of substrate such that the component mounting work time of each of the respective component mounting machines 5A1 to 5E2 is made equal, and distributes the respective pieces of sequence data DW of work data. The identifier IDs corresponding to the respective pieces of distributed sequence data DW are collected for each of the component mounting machines 5A1 to 5E2 to create identifier ID groups of the respective component mounting machines 5A1 to 5E2, and the identifier ID groups are collected for each of the mounting lines 2A, 2B, 2D, and 2C+2E to create distribution data.

Specifically, as shown in FIG. 4, distribution data DDA of the mounting line 2A has a data configuration in which the identifier ID group [1,4,5,14,16] for the component mounting machine 5A1, the identifier ID group [3,7,8,10] for the component mounting machine 5A2, the identifier ID group [2,6,11,13,15] for the component mounting machine 5A3, and the identifier ID group [9,12] for the component mounting machine 5A4 are collected. Similarly, distribution data DDB of the mounting line 2B has a data configuration in which the identifier ID groups [1,3,4,5,14,16], [2,7,8,10,15], and [6,9,11,12,13] for the component mounting machines 5B1, 5B2, and 5B3 are collected, distribution data DDCE for the mounting line 2C+2E has a data configuration in which the identifier ID groups [4,14,16], [1,13], [2,6,7,8,11], and [3,5,9,10,12,15] for the component mounting machines 5C1, 5C2, 5E1, and 5E2 are collected, and distribution data DDD of the mounting line 2D has a data configuration in which the identifier ID groups [2,4,14,15], [1,3,7,8,10], [5,8,12], and [6,10,11,13] for the component mounting machines 5D1, 5D2, 5D3, and 5D4 are collected.

The registration management unit 34 registers and manages distribution data for each of the mounting lines 2A, 2B, 2C+2E, and 2D. The work time calculation unit 35 obtains the component mounting work time of each of the component mounting machines 5A1 to 5E2 based on the distributed work data. As described referring to FIG. 6, the component mounting work time is the total time when the component mounting operation to suck the component P, to move the component P on the substrate B, to mount the component P, and to move the component P to the feeder 11 is repeated by the number of mounting components of work data.

The work time display unit 36 classifies the obtained component mounting work time of each of the component mounting machines 5A1 to 5E2 for each of the mounting lines 2A, 2B, 2C+2E, and 2D. The maximum work time among the classified work times of each of the mounting lines 2A, 2B, 2C+2E, and 2D is selected as the cycle time for each of the mounting lines 2A, 2B, 2C+2E, and 2D and is displayed on the display device 39. The data display unit 38 displays configuration data, work data, and distribution data on the display device 39.

Figure 5:
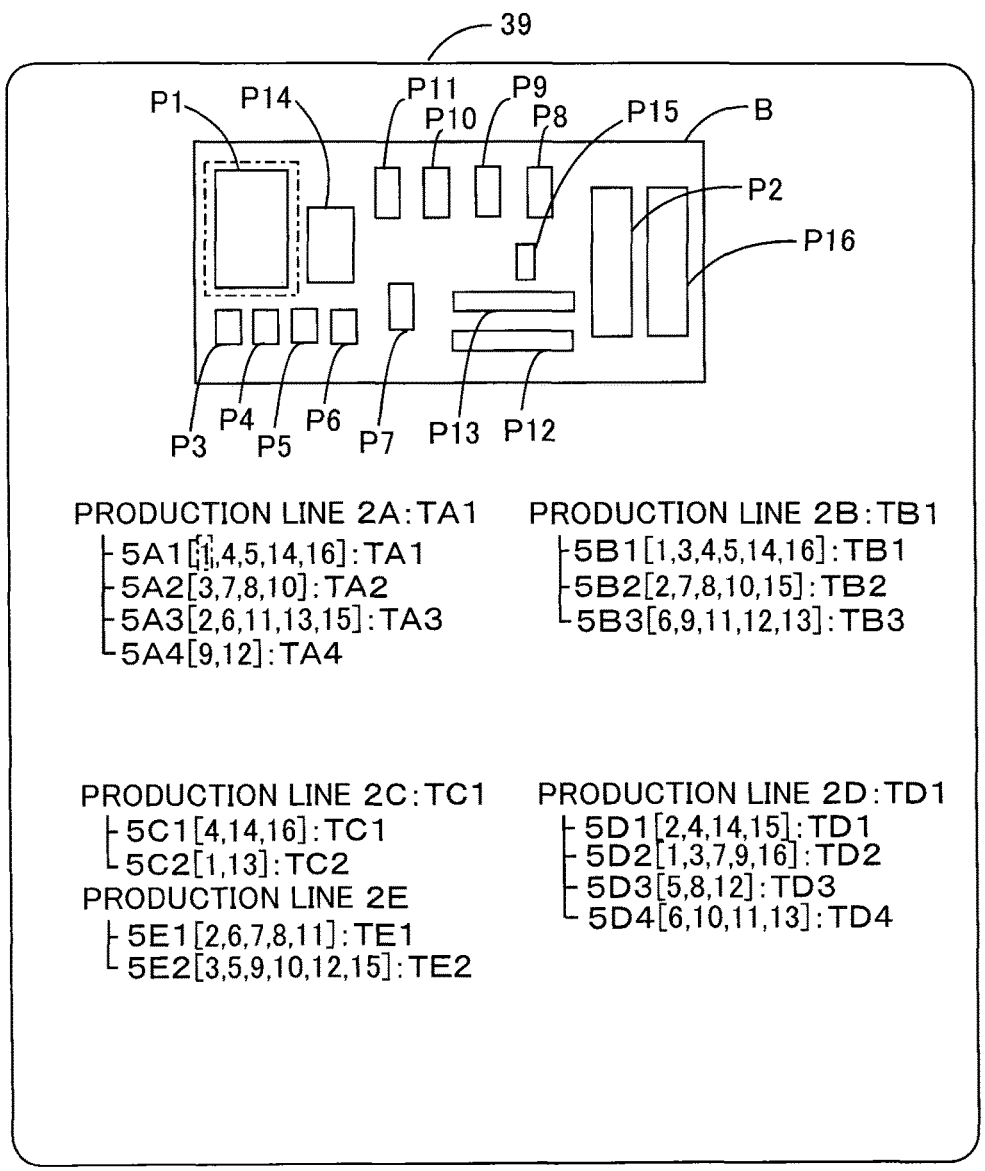
FIG. 5 is a diagram showing data of FIG. 4 displayed on a display device of the management computer of FIG. 2.

Specifically, as shown in FIG. 5, in the upper portion of the screen of the display device 39, a plan view showing the entire substrate B with components P1 to P16 scheduled for mounting mounted thereon is displayed. In the lower portion of the screen of the display device 39, the component mounting machines 5A1 to 5A4 which configure the mounting line 2A and the mounting line 2A capable of mounting the components P1 to P16 on the substrate B are displayed in a tree shape. The identifier ID group [1,4,5,14,16] and a component mounting work time TA1 are displayed as distribution data DDA for the component mounting machine 5A1 in line with the display of the component mounting machine 5A1. Similarly, the identifier ID groups [3,7,8,10], [2,6,11,13,15], and [9,12] and component mounting work times TA2, TA3, and TA4 are displayed as distribution data DDA for the component mounting machines 5A2, 5A3, and 5A4 in line with the display of the component mounting machines 5A2, 5A3, and 5A4. The maximum work time of the mounting line 2A, that is, the cycle time of the mounting line 2A, for example, TA1 is displayed in line with the display of the mounting line 2A. Similarly, for the mounting lines 2B, 2C+2E, and 2D, the component mounting machines 5B1 to 5B3, 5C1 and 5C2+5E1 and 5E2, 5D1 to 5D4, distribution data DDB, DDC+DDE, and DDD for the component mounting machines 5B1 to 5B3, 5C1 and 5C2+5E1 and 5E2, and 5D1 to 5D4, component mounting work times TB1 to TB3, TC1 and TC2+TE1 and TE2, and TD1 to TD4, and the cycle times, for example, TB1, TC1, and TD1 are displayed. With this, it is possible to select an optimum mounting line from a plurality of mounting lines 2A, 2B, 2C+2E, and 2D according to manufacturing planning of the substrate B.

The data rearrangement unit 37 rearranges the displayed distribution data according to a command to rearrange distribution data input from the outside. While optimum distribution data is created such that the component mounting work time of each of the component mounting machines 5A1 to 5E2 is made equal, for example, when defective component mounting occurs in a certain component mounting machine, it is necessary to execute sequence data DW of component mounting in another component mounting machine. In this case, it is sufficient to rearrange the identifier IDs of sequence data DW in a component mounting machine, in which defective component mounting occurs, to the identifier IDs of sequence data DW of another component mounting machine.

Specifically, as shown in FIG. 5, the operator drags and drops or the like the identifier IDs of work data DW to be rearranged among distribution data DDA to DDE displayed on the display device 39 with a touch pen or the like, thereby rearranging the identifier IDs of work data DW. At this time, the data display unit 38 may cause the component P corresponding to the identifier ID of work data DW touched by the operator to blink. For example, when the identifier ID "1" (ID surrounded by one-dot-chain line) of the component mounting machine 5A1 of the production line 2A is touched, the component "P1" on the substrate B (ID surrounded by one-dot-chain line) blinks. With this, the operator can view the component P corresponding to work data DW to be rearranged, whereby it is possible to prevent an edition error. The data display unit 38 may display a production line currently in production, a production line currently in editing, or the like in a different color or character. With this, the operator can easily distinguish a production line currently in production and a production line currently in editing.

Figure 3:
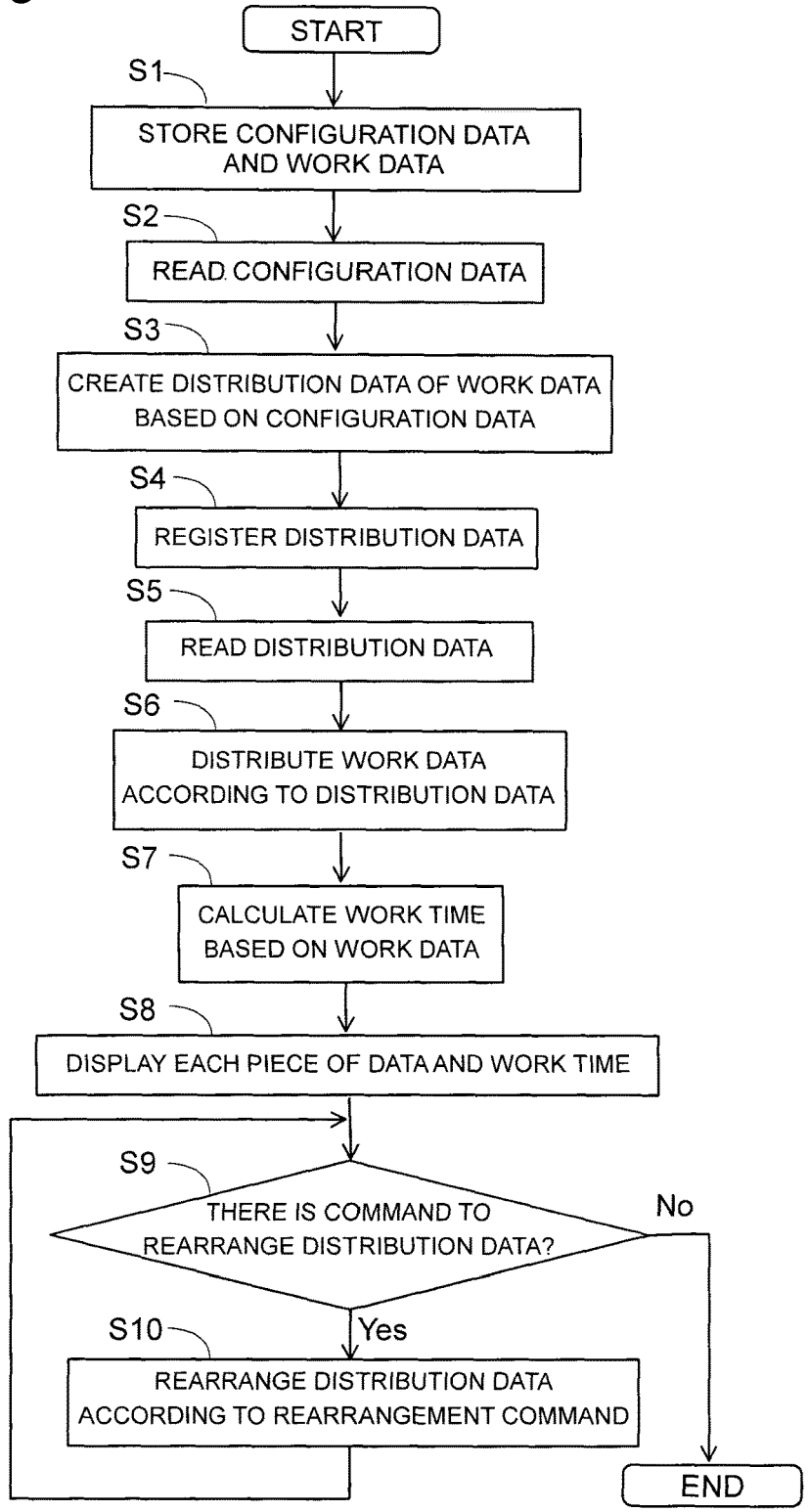
FIG. 3 is a flowchart illustrating the operation of the management computer of FIG. 2.

Next, a data registration operation of the management system 1 for mounting lines will be described referring to the flowchart of FIG. 3. The management computer 3 stores configuration data DSA to DSE input from the outside, work data DW, and the IDs (Step S1). The stored configuration data DSA to DSE are read (Step S2), and distribution data DDA to DDE of work data DW and the IDs are created and registered based on the read configuration data DSA to DSE (Steps S3 and S4).

The management computer 3 reads the registered distribution data DDA to DDE (Step S5), and distributes work data DW according to the read distribution data DDA to DDE (Step S6). The work times TA1 to TE2 and the total sums TTA to TTE are calculated based on the distributed work data DW (Step S7), configuration data DSA to DSE, the identifier IDs of work data DW, and distribution data DDA to DDE are displayed on the display device 39, and the calculated work times TA1 to TE2 and the cycle times TA1, TB1, TC1, and TD1 are displayed on the display device 39 (Step S8).

The management computer 3 determines whether or not a command to rearrange the identifier IDs of work data DW is input (Step S9), when the command to rearrange the identifier IDs of work data DW is input, rearranges the identifier IDs of work data DW according to the rearrangement command, displays the identifier IDs of work data DW on the display device 39 again (Step S10), returns to Step S9, and determines whether or not a command to rearrange the identifier IDs of work data DW is input again. In Step S9, when a command to rearrange the identifier IDs of work data DW is not input, the entire processing ends. The management system 1 controls and manages component mounting in the respective mounting lines 2A to 2E based on the registered data.

As described above, according to the management method for mounting lines of this embodiment, since distribution data DDA to DDE are registered and managed for the respective mounting lines 2A to 2E, it is possible to manage work data DW in a unitary manner. With this, it is possible to manage manufacturing of the substrate B with the component P mounted thereon in a plurality of mounting lines 2A to 2E with a small amount of data. Furthermore, since the amount of data is made small, it is possible to easily perform data edition and to perform data transfer in a short time. It is also possible to construct the management system 1 capable of managing manufacturing of the substrate B with the component P mounted thereon in a plurality of mounting lines 2A to 2E with a small amount of data and to simplify a system configuration.

Distribution data DDA to DDE are created by the identifier IDs added to work data DW. With this, it is possible to achieve reduction in the amount of data. When managing a plurality of mounting lines 2A, 2B, 2C+2E, and 2D which mount the components on the same type of substrate B, the management system 1 displays the maximum work time among the work times of each of the mounting lines 2A, 2B, 2C+2E, and 2D, that is, the cycle times of the mounting lines 2A, 2B, 2C+2E, and 2D, for example, TA1, TB1, TC1, and TD1. With this, the operator can select a mounting line with high manufacturing efficiency for the substrate B with the component P mounted thereon from a plurality of mounting lines 2A to 2E and can easily confirm the index of manufacturing planning of the substrate B with the component P mounted thereon. The management system 1 rearranges distribution data DDA to DDE according to external input. With this, the operator can improve manufacturing efficiency of the substrate B with the component P mounted thereon in a plurality of mounting lines 2A to 2E.

When managing a plurality of mounting lines 2A to 2E, the management system 1 stores the mounting position of the component P expressed by the coordinate system of the substrate B as work data. With this, for each of a plurality of component mounting machines 5A1 to 5E2, it is not necessary to store the mounting position of the component P expressed by the coordinate system of the machine, and mounting can be performed by converting the mounting position of the component P expressed by the coordinate system of the substrate B in each of the component mounting machines 5A1 to 5E2 to the mounting position of the component P expressed by the coordinate system of the device. For example, since sequence data $W_1$, $W_4$, $W_5$, $W_{14}$, and $W_{16}$ corresponding to the identifiers ID 1, 4, 5, 14, and 16 are transmitted to the control device 6A1 of the component mounting machine 5A1 of the mounting line 2A, the mounting position of the component expressed by the coordinate system of the substrate of each piece of sequence data $W_1$, $W_4$, $W_5$, $W_{14}$, and $W_{16}$ may be converted to the mounting position of the component P expressed by the coordinate system of the component mounting machine 5A1. Therefore, it is possible to manage substrate manufacturing in a plurality of mounting lines 2A to 2E with a small amount of data. In the above-described embodiment, although the mounting lines have been described as an example, the present disclosure can be applied to any production lines which produce products.

INDUSTRIAL APPLICABILITY

The management method and the management system for production lines of the present disclosure can be applied to a case where production in a plurality of production lines is managed with a small amount of data.

Reference Signs List

1: mounting line management system, 2A, 2B, 2C, 2D, 2E: mounting line, 3: management computer, 4: communication network, 5A1 to 5E2: component mounting machine, 31: configuration data storage unit, 32: work data storage unit, 33: distribution data creation unit, 34: registration management unit, 35: work time calculation unit, 36: work time display unit, 37: data rearrangement unit, 38: data display unit, 39: display device.

The invention claimed is:

1. A management system for production lines producing products, the management system comprising:
component mounting machines arranged on the production lines, at least one of the production lines manufacturing a substrate; and
a management computer configured to:
store configuration data of the component mounting machines that configures production and work data regarding work to produce the products,
create distribution data for distributing the work data to the component mounting machines based on the configuration data such that a work time of each of the component mounting machines is made equal,
register and manage the distribution data for each of the production lines,
distribute the work data to the component mounting machines based upon the distribution data, the work data including a mounting position of each of a plurality of components expressed by a coordinate system of the substrate and not including a mounting position of any of the plurality of components expressed by a coordinate system of the component mounting machines, and
convert the mounting position of each of the plurality of components expressed by the coordinate system of the substrate included in the work data to the mounting position of each of the plurality of components expressed by the coordinate system of the component mounting machines based on a sequence of mounting each of the plurality of components, wherein
each of the plurality of components is mounted at the converted mounting position of each of the plurality of components expressed by the coordinate system of the component mounting machines.

2. A management system for production lines producing products, the management system comprising:
component mounting machines arranged on the production lines, at least one of the production lines manufacturing a substrate;
configuration data storage means for storing configuration data of working machines configuring the production lines;
work data storage means for storing work data regarding work to produce the products;
distribution data creation means for creating distribution data to distribute the work data to the working machines based on the configuration data such that a work time of each of the working machines is made equal; and
registration management means for registering and managing the distribution data for each production line and distributing the work data to the working machines based upon the distribution data, the work data including a mounting position of each of a plurality of components expressed by a coordinate system of the substrate and not including a mounting position of any of the plurality of components expressed by a coordinate system of the working machines, wherein
the mounting position of each of the plurality of components expressed by the coordinate system of the substrate included in the work data is converted to the mounting position of each of the plurality of components expressed by the coordinate system of the component mounting machines based on a sequence of mounting each of the plurality of components, and
each of the plurality of components is mounted at the converted mounting position of each of the plurality of components expressed by the coordinate system of the component mounting machines.

3. The management system according to claim 2, wherein the work data storage means stores the work data with an identifier added thereto, and
the distribution data creation means creates the distribution data using the identifier.

4. The management system according to claim 2, further comprising:
work time calculation means for obtaining a work time of each of the working machines included in the production lines based on the distributed work data; and
work time display means for classifying the obtained work time of each of the working machines for each of the production lines, selecting a maximum work time among the classified work times for each of the production lines, and displaying the maximum work time on a display device.

5. The management system according to claim 2, further comprising:
data display means for displaying the configuration data, the work data, and the distribution data on a display device; and
data rearrangement means for rearranging the displayed distribution data according to a command to rearrange the distribution data, the command being input from the outside based on the displayed configuration data, work data, and distribution data.

6. The management system according to claim 2, wherein the work data storage means stores the work data with an identifier added thereto,
the distribution data creation means creates the distribution data using the identifier, and
the management system further includes data display means for displaying the distribution data as a series of the identifiers without the work data.

7. The management system according to claim 5, wherein the display means displays the rearrangement of the displayed distribution data as a drag and drop on the display device based upon the command.

8. The management system according to claim 5, wherein the display means highlights a selected identifier of the work data and a corresponding component of a product based upon the command.

9. The management system according to claim 5, wherein the command indicates rearranging identifier IDs of the work data when a defective component mounting occurs in one of the component mounting machines.

10. The management system according to claim 7, wherein the display means displays the drag and drop of a selected identifier of the work data on the display device based upon the command.

11. A management system for production lines producing products, the management system comprising:
- component mounting machines arranged on the production lines, at least one of the production lines manufacturing a substrate; and
- circuitry configured to:
- store configuration data of working machines that configure the production lines in a memory;
- store work data regarding work to produce the products in the memory;
- create distribution data to distribute the work data to the working machines based on the configuration data such that a work time of each of the working machines is made equal; register and manage the distribution data for each production line,
- distribute the work data to the working machines based upon the distribution data, the work data including a mounting position of each of a plurality of components expressed by a coordinate system of the substrate and not including a mounting position of any of the plurality of components expressed by a coordinate system of the working machines, and
- convert the mounting position of each of the plurality of components expressed by the coordinate system of the substrate included in the work data to the mounting position of each of the plurality of components expressed by the coordinate system of the component mounting machines based on a sequence of mounting each of the plurality of components, wherein
- each of the plurality of components is mounted at the converted mounting position of each of the plurality of components expressed by the coordinate system of the component mounting machines.

12. The management system according to claim 11, wherein the circuitry is configured to:
- store the work data with an identifier added thereto, and
- create the distribution data using the identifier.

13. The management system according to claim 11, wherein the circuitry is configured to:
- obtain a work time of each of the working machines included in the production lines based on the distributed work data,
- classify the obtained work time of each of the working machines for each of the production lines,
- select a maximum work time among the classified work times for each of the production lines, and
- display the maximum work time on a display device.

14. The management system according to claim 11, wherein the circuitry is configured to:
- display the configuration data, the work data, and the distribution data on a display device; and
- rearrange the displayed distribution data according to a command to rearrange the distribution data, the command being input from the outside based on the displayed configuration data, work data, and distribution data.

15. The management system according to claim 11, wherein the circuitry is configured to:
- store the work data with an identifier added thereto,
- create the distribution data using the identifier, and
- display the distribution data as a series of the identifiers without the work data.

16. The management system according to claim 14, wherein the circuitry is configured to display the rearrangement of the displayed distribution data as a drag and drop on the display device based upon the command.

17. The management system according to claim 14, wherein the circuitry is configured to highlight a selected identifier of the work data and a corresponding component of a product based upon the command.

18. The management system according to claim 14, wherein
the command indicates rearranging identifier IDs of the work data when a defective component mounting occurs in one of the component mounting machines.

19. The management system according to claim 16, wherein the circuitry is configured to display the drag and drop of a selected identifier of the work data on the display device based upon the command.

* * * * *